(12) United States Patent
Rohde et al.

(10) Patent No.: US 7,292,113 B2
(45) Date of Patent: Nov. 6, 2007

(54) MULTI-OCTAVE BAND TUNABLE COUPLED-RESONATOR OSCILLATOR

(75) Inventors: Ulrich L. Rohde, Upper Saddle River, NJ (US); Ajay Kumar Poddar, Fairlawn, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 0 days.

(21) Appl. No.: 10/937,525

(22) Filed: Sep. 9, 2004

(65) Prior Publication Data

US 2005/0084053 A1  Apr. 21, 2005

Related U.S. Application Data

(60) Provisional application No. 60/563,481, filed on Apr. 19, 2004, provisional application No. 60/528,670, filed on Dec. 11, 2003, provisional application No. 60/527,957, filed on Dec. 9, 2003, provisional application No. 60/501,790, filed on Sep. 10, 2003, provisional application No. 60/501,371, filed on Sep. 9, 2003.

(51) Int. Cl.
*H03B 5/12* (2006.01)
(52) U.S. Cl. ................. 331/117 R; 331/36 C
(58) Field of Classification Search ............ 331/117 R, 331/36 C
See application file for complete search history.

(56) References Cited

U.S. PATENT DOCUMENTS

| | | | |
|---|---|---|---|
| 2,502,488 A | 4/1950 | Shockley | |
| 2,524,035 A | 10/1950 | Bardeen et al. | |
| 3,373,379 A | 3/1968 | Black | |
| 4,435,688 A | 3/1984 | Shinkawa et al. | |
| 4,527,130 A | 7/1985 | Lutteke | |
| 4,619,001 A | 10/1986 | Kane | |
| 4,621,241 A | 11/1986 | Kiser | |
| 4,633,197 A | 12/1986 | Vanderspool, II | |
| 4,692,714 A | 9/1987 | Galani | |
| 4,812,784 A | 3/1989 | Chung et al. | |
| 4,868,526 A | 9/1989 | Camiade | |
| 5,041,799 A | 8/1991 | Pirez | |
| 5,231,361 A | 7/1993 | Smith et al. | |

(Continued)

FOREIGN PATENT DOCUMENTS

DE  3443446 A  5/1986

(Continued)

OTHER PUBLICATIONS

A. K. Poddar, S.K. Koul, and B. Bhat, "Millimeter Wave Evanescent Mode Gunn Diode Oscillator in Suspended Stripline Configuration." 22nd International Conference on Millimeter Waves, pp. 265-265, Jul. 1997.

(Continued)

*Primary Examiner*—Joseph Chang
(74) *Attorney, Agent, or Firm*—Lerner, David, Littenberg, Krumholz & Mentlik, LLP

(57) ABSTRACT

In one aspect, a voltage controlled oscillator is provided that includes circuitry comprising tunable coupled resonator networks, which are coupled to a terminal of a pair of three-terminal devices through a tuning voltage network which supports wide-band tunability. In another aspect, a wide-band tunable resonator is provided that is amenable to integration in the integrated circuit form.

24 Claims, 13 Drawing Sheets

U.S. PATENT DOCUMENTS

| | | | |
|---|---|---|---|
| 5,373,264 | A | 12/1994 | Higgins |
| 5,402,087 | A | 3/1995 | Gorczak |
| 5,650,754 | A | 7/1997 | Joshi |
| 5,661,439 | A | 8/1997 | Watkins et al. |
| 5,748,051 | A | 5/1998 | Lewis |
| 5,854,578 | A | 12/1998 | Minasi et al. |
| 5,900,788 | A | 5/1999 | Hagemeyer et al. |
| 6,124,767 | A | 9/2000 | Woods |
| 6,297,708 | B1 | 10/2001 | Lemay |
| 6,326,854 | B1 * | 12/2001 | Nicholls et al. ............... 331/56 |
| 6,489,853 | B1 | 12/2002 | Lewis |
| 6,624,726 | B2 | 9/2003 | Niu |
| 6,630,869 | B2 | 10/2003 | Flynn et al. |
| 6,714,088 | B2 | 3/2004 | Chang |
| 6,714,772 | B2 | 3/2004 | Kasahara et al. |
| 6,731,181 | B2 | 5/2004 | Fukayama et al. |
| 6,734,745 | B2 | 5/2004 | Sakai |
| 6,737,928 | B2 | 5/2004 | Kubo et al. |
| 2001/0004225 | A1 | 6/2001 | Nicholls et al. |
| 2001/0030583 | A1 | 10/2001 | Ikarashi |
| 2001/0035794 | A1 | 11/2001 | Fujidai et al. |
| 2002/0084860 | A1 | 7/2002 | Festag et al. |
| 2003/0160660 | A1 | 8/2003 | Chang et al. |
| 2004/0095197 | A1 | 5/2004 | Wang et al. |
| 2004/0130402 | A1 | 7/2004 | Marquardt |
| 2005/0156683 | A1 | 7/2005 | Rohde et al. |
| 2005/0242896 | A1 | 11/2005 | Rohde et al. |
| 2005/0280478 | A1 | 12/2005 | Patel et al. |

FOREIGN PATENT DOCUMENTS

| | | |
|---|---|---|
| EP | 0 475 262 A | 3/1992 |
| EP | 0 800 224 A | 10/1997 |
| EP | 0 823 777 | 2/1998 |
| EP | 0 843 374 A | 5/1998 |
| EP | 1 093 216 A | 4/2001 |
| JP | 59-072205 A | 4/1984 |
| JP | 59-139708 A | 8/1984 |
| WO | WO-02/17476 A | 2/2002 |
| WO | WO-02/05416 A1 | 11/2002 |
| WO | WO-2005/015731 | 2/2005 |

OTHER PUBLICATIONS

D. Ham, A. Hajimiri, "Concepts and Methods in Optimization of Integrated LCVCOs, " IEEE Journal of Solid-state Circuits, Jun. 2001.

Douglas R. Jachowski, "Passive Enhancement of Resonator Q in Microwave Notch Filters", IEEE MTT-S Digest, pp. 1315-1318, Jun. 2004.

E. Hegazi, H. Sjoland, and A. Abidi, "A Filtering Technique to Lower LC Oscillator Phase Noise," IEEE J. Solid-State Circuits, vol. 36, pp. 1921-1929, Dec. 2001.

Franz X. Sinnesbichler, "Hybrid Millimeter-Wave Push-Push Oscillators using Silicon-Germanium HBTs, "IEEE MTT-S, vol. 51, Feb. 2003.

H.C. Chang,"Phase noise self-injection-locked oscillators—Theory and experiment, "IEEE Transaction on Microwave Theory and Techniques, vol. 51, No. 9, pp. 1994-1999, Sep. 2003.

Henkes, Dale D, 'Designing Short High Q Resonators', Design, Dec. 2003, pp. 75-109.

J. C. Nallatamby, M. Prigent, M. Camiade, J. Obregon, "Phase Noise in Oscillators-Leeson Formula Revisited," IEEE Transactions on Microwave Theory and Techniques, vol. 51, No. 4, pp. 1386-1394, Apr. 2003.

M. Odyniec, Editor, RF and Microwave Oscillator Design, Chapter 3: Linearity, Time Variation, and Oscillator Phase Noise, by T. Lee and A. Hajimiri, Artech House, 2002.

M. Vidmar, "A Wideband, Varactor-Tuned Microstrip VCO," Microwave Journal, Jun. 1999.

U.L. Rohde, "A Novel RFIC for UHF Oscillators (Invited)," 2000 IEEE Radio Frequency Integrated Circuits (RFIC) Symposium, Boston, MA, Jun. 11-13, 2000.

U.L. Rohde, D.P. Newkirk, RF/Microwave Circuit Design for Wireless Applications, pp. (123-197; Chapter 5), John Wiley & Sons, Apr. 2000, ISBN 0-471-29818-2.

U.L. Rohde, A Novel RFIC for UHF Oscillators (Invited), 2000 IEEE Radio Frequency Integrated Circuits (RFIC) Symposium, Boston, MA, Jun. 11-13, 2000.

Ulrich Rohde, "A New and Efficient Method of Designing Low Noise Microwave Oscillators," PhD Dissertation, Technical University of Berlin, 2004.

A. K. Poddar and K. N. Pandey, "Microwave Switch using MEMS technology," 8th IEEE International Symposium, EDMO-2000, pp. 134-139, Nov. 2000, UK.

A. M. Elsayed and M. I. Elmasry,"Low-Phase-Noise LC Quadrature VCO using Coupled Tank Resonators in Ring, " IEEE, JSSC, vol. 36, pp. 701-705, Apr. 2001.

A. Ward and B. Ward, "A Comparison of various Bipolar Transistor Biasing Circuits," Applied Microwave & Wireless, vol. 13, pp. 30-52, 2001.

A.V. Grebennikov, "Microwave Transistor Oscillators: an Analytic Approach to Simplify Computer-Aided Design", Microwave Journal, pp. 294-299, May 1999.

Amir Mortazawi, Heinrich D. Foltz, and Tatsuo Itoh, "A Periodic Second Harmonic Spatial Power Combining Oscillator", IEEE, MTT, vol. 40, pp. 851-856, May 1992.

Andrea Borgiolo, Pochi Yeh, and Robert A. York, "Analysis of Oscillators with External Feedback Loop for Improved Locking Range and Noise Reduction," IEEE Trans. MTT, vol. 47, pp. 1535-1543, Aug. 1999.

Andrew V. Grebennikov, "Microwave FET Oscillators: an Analytic Approach to Simplify Computer-Aided Design", Microwave journal, pp. 102-111, Jan. 2000.

B. Van der Pol, "The Nonlinear Theory of Electrical Oscillators, "Proc. IRE, vol. 22 No. 9, pp. 1051-1086, Sep. 1934.

Byeong-Ha Park, "A Low-Voltage, Low Power, CMOS 900 MHz Frequency Synthesizer," Ph.D. Dissertation, Georgia Institute of Technology, Dec. 1997.

C. Arnaud, D. Basataud, J. Nebus, J. Teyssier, J. Villotte, D. Floriot, "An Active Pulsed RF and Pulsed DC Load-Pull System for the Characterization of HBT Power Amplifiers Used in Coherent Radar and Communication Systems," IEEE Transactions on Mfl, vol. 48, No. 12, pp. 2625-2629, Dec. 2000.

D. B. Leeson, A Simple Model of Feedback Oscillator Noise Spectrum, Proc. IEEE, pp. 329-332, 1966.

F. X. Sinnesbichier, B. Hauntz and O. R. Olbrich, "A Si/SiGe HBT Dielectric Resonator Push-Push Oscillators at 58 GHz, " IEEE Microwave Guided Wave Lett. vol. 10, pp. 145-147, Apr. 2000.

F. X. Sinnesbichler and O. R. Olbrich, "SiGe HBT Push-Push Oscillators for V-Band Operation, " IEEE MTT-S silicon Monolithic Integrated Circuits in RF Systems Symp., Garmisch, Germany, Apr. 26-28, 2000, pp. 55-59.

F. X. Sinnesbichler, B. Hautz, G. R. Olbrich,"A Low Phase Noise 58 GHz SiGe HBT Push-Push, Oscillator with Simultaneous 29 GHz Output", IEEE, MTT-S Digest, pp. 35-38, 2000.

F. X. Sinnesbichler, H. Geltinger, and G. R. Olbrich, "A 38 0Hz Push-Push Oscillator Based on 25 GHZ-fT BJTs, " IEEE Microwave Guided Wave Lett. vol. 9 pp. 151-153, Apr. 1999.

F.M. Ghannouchi, R. Larose, R.G. Bosisio, "A New Multi-harmonic Loading Method for Large-Signal Microwave and Millimeter-Wave Transistor Characterization," IEEE Transactions on MTT, vol. 39, No. 6, pp. 986-992, Jun. 1991.

Franco Ramirez, Jose Lius Garcia H., Tomas Fernandez and Almudena Suarez,"Nonlinear Simulation Techniques for the Optimized Design of Push-Push Oscillators", IEEE, MTT-S Digest, pp. 2157-2160, 2003.

H. Abe, Y. Aono, 11 GHz GaAs Power MESFET Load-Pull Measurements Utilizing a New Method of Determining Tuner Y-Parameters, IEEE Transactions on Microwave Theory and Techniques, vol. 27, No. 5, pp. 394-399, May 1979.

H. Stark, and J. W. Woods, Probability, Random Processes, and Estimation Theory for Engineers. New York: Prentice Hall, 1986.

Hai Xiao, Takayuki Tanka and Masayoshi Aikawa, "A Ka-Band Quadruple-Push Oscillator", IEEE, MTT-S Digest, pp. 889-892, 2003.

Heng-Chia Chang, "Analysis of Coupled Phase-Locked Loops With Independent Oscillators for Beam Control Active Phased," IEEE Trans. MTT, vol. 52, pp. 1059-1065, Mar. 2004.

Heng-Chia Chang, Xudong Cao, Mark J. Vaughan, Umesh K. Mishra, and R. York,"Phase Noise in Externally Injection-Locked Oscillator Arrays," IEEE Trans. MTT, vol. 45; pp. 2035-2042, Nov. 1997.

Heng-Chia Chang, Xudong Cao, Umesh K. Mishra, and R. York, "Phase Noise in Coupled Oscillators: Theory and experiment," IEEE Trans. MTT, vol. 45, pp. 604-615, May 1997.

J. Everard, Fundamentals of RE Circuit Design with Low Noise Oscillators, John Wiley & Sons. Ltd, 2001.

J. Heinbockel and A. Mortazawi,"A Periodic Spatial Power Combining MESFET Oscillator", IEEE, MTT-S Digest, pp. 545-548, 1992.

J. R. Bender, C. Wong, Push-Push Design Extends Bipolar Frequency Range, Microwave & RF, pp. 91-98, Oct. 1983.

Jeong-Geun Kim, Dong-Hyun Baek, Sang-Hoon Jeon, Jae-Woo Park and Songcheol Hong, A 60 GHz InGaP/GaAs HBT Push-Push MMIC VCO, IEEE, MTT-S Digest, pp. 885-888, 2003.

Jonathan J. Lynch and Robert A. York, "Synchronization of Oscillators Coupled through Narrow-Band Networks," IEEE Trans. MTT, pp. 238-249, Feb. 2001.

Jonathan J. Lynch and Robert A. York, "An Analysis of Mode-Locked Arrays of Automatic Level Control Oscillators," IEEE Trans. on Circuits and Systems-I, vol. 41, pp. 859-865, Dec. 1994.

Jwo-Shiun Sun, "Design Analysis of Microwave Varactor-Tuned Oscillators", Microwave journal, pp. 302-308, May 1999.

K. W. Kobayashi et al., "A 108-0Hz InP-based HBT Monolithic Push-Push VCO with Low Phase Noise and Wide Tuning Bandwidth, " IEEE J. Solid-State Circuits, vol. 34, pp. 1225-1232, Sep. 1999.

K.O,"Estimation Methods for Quality Factors of Inductors Fabricated in Silicon Integrated Circuit Process Technologies, "IEEE, JSSS, pp. 1565-1567, Sep. 1997.

Kaneyuki Kurokawa, "Noise in Synchronized Oscillators," IEEE Trans. MTT, vol. 16, pp. 234-240, Apr. 1968.

Kaneyuki Kurokawa, "The Single Cavity Multiple Device Oscillator," IEEE Trans. MTT, vol. 19, pp. 793-801, Oct. 1971.

Klaus F. Schunemann and Karl Behm, "Nonlinear Noise Theory for Synchronized Oscillators," IEEE Trans. MTT, vol. 27, pp. 452-458, May 1979.

L. Dussopt, D. Guillois, and O. Rebeiz, "A Low Phase Noise Silicon 9 0Hz VCO and an 18 0Hz Push-Push Oscillator, "IEEE MTT-S. Digest, 2002, pp. 695-698.

M. Kuramitsu and F. Takasi, "Analytical method for Multimode Oscillators Using the Averaged Potential, "Elec. Communication Japan, vol. 66-A, pp. 10-19, 1983.

M. Regis, 0. Llopis, and J. Graffeuil, "Nonlinear Modeling and Design of Bipolar Transistor Ultra Low Phase-Noise Dielectric-Resonator Oscillators", IEEE transaction on MTT, vol. 46, No. 10, pp. 1589-1593, Oct. 1998.

M. Schott, H. Kuhnert, J. Hilsenbeck, J. Wurlf, and H. Heinrich, "38 GHz Push-Push GaAs-HBT MMIC Oscillator, "IEEE MTT-S, Digest, 2002, pp. 839-842.

M. Ticbout,"Low power, Low Phase Noise, Differentially Tuned Quadrature VCO Design in Standard CMOS, " IEEE- JSSS, vol. 36, pp. 10 18-1024, Jul. 2001.

Mortazawi A and B. C. De Loach, Jr., "Multiple Element Oscillators Utilizing a New Power Combining Technique, " in IEEE MTT-S Tnt. Microwave Symp. Dig., 1992, pp. 1093-1096.

P. Berini, M. Desgagne, F.M. Ghannouchi, R.G. Bosisio, "An Experimental Study of the Effects of Harmonic Loading on Microwave MESFET Oscillators and Amplifiers," IEEE Transaction on MTT, vol. 42, No. 6, pp. 943-950, Jun. 1994.

Q. Cai, J. Gerber, S. Peng, "A Systematic Scheme for Power Amplifier Design Using a Multi-Harmonic Load-Pull Simulation Technique," 1998 IEEE MTT-S Symposium Digest, vol. 1, pp. 161-165, Jun. 7-12, 1998.

R. A. York and R.C. Compton,"Mode-Locked Oscillator Arrays", IEEE Microwave and Guided Letter, vol. 1, pp. 215-218, Aug. 1991.

R. A. York, "Nonlinear Analysis of Phase Relationship in Quasi-Optical Oscillator Arrays, "IEEE Trans. Microwave Theory Tech., vol. 41, pp. 1799-1809, Oct. 1993.

R. A. York, P. Liao, and J. J. Lynch, "Oscillator Array Dynamics with Broad-Band N-Port Coupling Networks, " IEEE Trans. Microwave Theory Tech., vol. 42, pp. 2040-2045, Nov. 1994.

R. Adler, "A Study of Locking Phenomena in Oscillators, "Proc. IEEE, vol. 61, pp. 180-1385, Oct. 1973.

R. G. Freitag, S.H. Lee, D.M. Krafcsik, D.E. Dawson and J. E. Degenford,"Stability and Improved Circuit Modeling Considerations for High Power MMIC Amplifiers", IEEE, MM-Wave Monolithic Circuits Symposium, pp. 2169-2172, 2003.

R. J. Hawkins, "Limitations of Nielsen's and Related Noise Equations Applied to Microwave Bipolar Transistors and a New Expression for the Frequency and Current Dependent Noise Figure," Solid-State Electron., vol. 20 pp. 191-196, 1977.

Reidar L. Kuvas, "Noise in Single Frequency Oscillators and Amplifiers," IEEE Trans. Microwave Theory Tech., vol. MTT-21, pp. 127-134, Mar. 1973.

Ronald G. Freitag, "A Unified Analysis of MMIC Power Amplifier Stability, "IEEE, MTT-S Digest, pp. 297-300, 1992.

S. Kudszus, W. H. Haydi, A. Tessmann, W. Bronner, and M. Schlechtweg, "PushPush Oscillators for 94 and 140 0Hz Applications Using Standard Pseudomorphic GaAs HEMTs, "IEEE MTT-S, Microwave Symp. Digest, 2001, pp. 1571-1574.

Shigeji Nogi, Jenshan Lin and Tatsuo Itoh., Mode Analysis and Stabilization of a Spatial Power Combining Array with Strongly Coupled oscillators, IEEE, MTT, vol. 41, pp. 1827-1837, Oct. 1993.

Shih-Chieh Yen and Tah-Hsiung Chu,"An Nth-Harmonic Oscillator Using an N-Push Coupled Oscillator Array with Voltage-Clamping Circuits", IEEE, MTT-S Digest, pp. 545-548, 1992.

T. H. Hsu and C.P. Snapp, "Low-Noise Microwave Biopolar Transistor with Sub-Half-Micrometer Emitter Width," IEEE Trans. Electron Devices, vol. ED-25, pp. 723-730, Jun. 1978.

U. L. Rohde, "A New and Efficient Method of Designing Low Noise Oscillators," Ph.D. Dissertation, Technical University of Berlin, Feb. 12, 2004.

U. L. Rhode, A. K. Poddar, Juergen Schoepf, Reimund Rebel, and Parimal Patel, "Low Noise Low Cost Wideband N-Push VCO," IEEE, IMS Symposium, MTT2005, USA.

U. L. Rohde, K. Juergen Schoepf, A.K. Poddar, "Low Noise VCOs Conquer Wideband," Microwaves & RF, pp. 98-106, Jun. 2004.

U.L. Rohde, "Improved Noise Modeling of GaAs FETS: Using an Enhanced Equivalent Circuit Technique," Microwave Journal, pp. 87-101—Nov. 1991.

U.L. Rohde, "Parameter Extraction for Large Signal Noise Models and Simulation of Noise in Large Signal Circuits Like Mixers and Oscillators," 23rd European Microwave Conference, Madrid, Spain, Sep. 6-9, 1993.

W. 0. Schlosser, "Noise in Mutually Synchronized Oscillators," IEEE Trans. Microwave Theory Tech., vol. MTT-16, pp. 732-737, Sep. 1968.

WA. Pucel, W. Struble, R Hallgren, U.L. Rohde, "A General Noise Dc-embedding Procedure for Packaged Two-Port Linear Active Devices," IEEE Transactions on MTT, vol. 40, No. 11, pp. 2013-2024, Nov. 1992.

Wing Shing Chan et al: "The design of oscillators using the cascode circuit" Circuits and Systems, 1994, vol. 5, pp. 689-692, May 30, 1994.

Y. Baeyens et al., "Compact inP-based HBT VCOs with a Wide Tuning Range at W-Band, "IEEE Trans. MTT, vol. 48, pp. 2403-2408, Dec. 2001.

Y. Sun, T. Tieman, H. Pflung, and W. Velthius, "A Fully Integrated Dual-Frequency Push-Push VCO for 5.2 and 5.8GHz Wireless Applications, " Microwave Journal., pp. 64-74, Apr. 2001.

Yu-Lung Tang and Huel Wang, "Triple-Push Oscillator Approach: Theory and Experiments," IEEE- JSS, vol. 36, pp. 1472-1479, Oct. 2001.

K. Poddar, "A Novel Approach for Designing Integrated Ultra Low Noise Microwave Wideband Voltage-Controlled Oscillators," Dec. 14, 2004.

* cited by examiner

MULTI-OCTAVE BAND TUNABLE COUPLED-RESONATOR OSCILLATOR

CROSS-REFERENCE TO RELATED APPLICATIONS

This application claims the benefit of the filing date of U.S. Provisional Application Nos. 60/501,371, filed on Sep. 9, 2003; 60/501,790, filed on Sep. 10, 2003; 60/527,957, filed on Dec. 9, 2003; 60/528,670, filed on Dec. 11, 2003; and 60/563,481, filed on Apr. 19, 2004, the disclosures of which are hereby incorporated herein by reference.

BACKGROUND

A voltage controlled oscillator (VCO) or oscillator is a component that can be used to translate DC voltage into a radio frequency (RF) voltage. The magnitude of the output signal is dependent on the design of the VCO circuit and the frequency of operation is determined by a resonator that provides an input signal. Clock generation and clock recovery circuits typically use VCOs within a phase locked loop (PLL) to either generate a clock from an external reference or from an incoming data stream. VCOs are therefore often critical to the performance of PLLs. In turn, PLLs are essential components in communication networking as the generated clock signal is typically used to either transmit or recover the underlying service information so that the information can be used for its intended purpose. PLLs are particularly important in wireless networks as they enable the communications equipment to quickly lock-on to the carrier frequency onto which communications are transmitted.

The popularity of mobile telephones has renewed interest in and generated more attention to wireless architectures. This popularity has further spawned renewed interest in the design of low noise wideband oscillators. The recent explosive growth in the new families of cellular telephones and base stations using universal mobile telephone systems (UMTS) has stirred a need for developing an ultra-low noise oscillator with a fairly wide tuning range (e.g., octave-band). The demands of wideband sources have generally increased telescopically because of the explosive growth of wireless communications. In particular, modern communication systems are typically multi-band and multi-mode, therefore requiring a wideband low noise source that preferably allows simultaneous access to DCS 1800, PCS 1900 and WCDMA (wideband code division multiple access) networks by a single wideband VCO.

The dynamic operating range and noise performance of a VCO may limit or affect the performance of the PLL itself, which in turn may affect the performance of the device in which the PLL is employed, e.g., RF transceivers, cell phone, modem card, etc. Broadband tunability of VCOs represents one of the more fundamental tradeoffs in the design of a VCO, impacting both the technology and the topology used. The dynamic time average quality factor (i.e., Q-factor) of the resonator as well as the tuning diode noise contribution affect the noise performance of a VCO. Furthermore, the dynamic loaded Q is, in general, inversely proportional to the operating frequency range of the VCO.

Despite the continuous improvement in VCO technology, low phase noise typically remains a bottleneck and poses a challenge to RF transceiver (transmitter-receivers) design. This is typically considered due to the more demanding parameters of the VCO design: low phase noise, low power consumption and wide frequency tuning range.

In LC-resonator based VCOs, phase noise and power consumption typically depend primarily on the time average loaded Q-factor of the resonator circuit and the non-linearities associated with the tuning network, which typically employ varactors. The frequency tuning range is determined by the usable capacitive tuning ratio of the varactor and parasitic associated with the tuning network because the parasitic deteriorates and limits the effective tuning capability of the varactor at a high frequency. As the loss-resistance of the tuning network (e.g., varactor and resonator) determines the quality factor, special attention is paid to the resistive behavior. The frequency range over which a coupled resonator circuit can be tuned by means of the tuning diode depends on the useful capacitance ratio of the tuning diode and on the parallel and series capacitance present in the circuit.

As the frequency for wireless communication shifts to higher and higher frequency bands, generation of an ultra-low noise, wideband, thermally stable and compact signal source at a relatively low cost becomes more and more challenging due to the frequency limitations of the active devices and broadband tunability of the tuning diode. In the past, wide tuning range and good phase noise performance were generally considered to be opposing requirements due to the problem of controlling the loop parameters and the dynamic loaded Q of the resonator over the range of wideband operation.

Typically, the phase noise of a microstrip line resonator-based wideband VCO is −80 dBc/Hz @10 KHz (kilo-hertz) for a frequency band of 1600-3200 MHz (mega hertz) operating at 15V (volts), 45 mA (milli-ampere). A YIG resonator based VCO offers wideband tunability with an external DC magnetic field, but at a high price. In addition, the YIG resonator based VCO is not amenable to integration in chip form.

Thus, there is a need for a wideband oscillator, preferably having octave-band tunability, that offers a cost-effective alternative to the YIG resonator based wideband VCO in the frequency range of the L (0.95-1.5 GHz), S (1.7-2.3 GHz), and C (4-6 GHz) bands.

SUMMARY OF THE INVENTION

In one aspect the present invention provides a topology that supports wide-band tunability in a compact size, which is amenable for implementation in integrated circuit form.

In another aspect, the present invention is a voltage controlled oscillator. The voltage controlled oscillator in accordance with this aspect of the present invention preferably comprises a first device having first, second and third terminals, a second device having first, second and third terminals and circuitry comprising tunable coupled resonator networks coupled to the second terminals of each of the devices through a tuning voltage network. Preferably, the voltage of the tuning network can be adjusted to tune an output signal of the voltage controlled oscillator over an octave frequency band.

Further in accordance with this aspect of the present invention, a bias network is desirably coupled between the first and third terminals of the first and second devices.

In accordance with this aspect of the present invention the oscillator further desirably comprises a dynamically tuned combiner network coupled between the third terminals of each of the devices to combine signals present at the third terminals into an output signal tunable over an operating frequency range that is approximately twice the fundamental frequency.

Preferably, the first and second devices each comprise bipolar transistors, although field effect transistors (FET) may also be employed.

It is also desirable that the tunable resonator networks comprise a pair of micro-strip coupled resonators preferably arranged in a horse-shoe configuration.

Further in accordance with this aspect of the present invention, the voltage controlled oscillator is desirably provided in the form of an integrated circuit.

In accordance with an additional aspect of the present invention, a voltage controlled oscillator having octave band tunability is provided. The oscillator preferably comprises a first and a second three-terminal device; circuitry for a tunable phase coupling network coupled between respective first terminals of the first device and second devices; and circuitry for a dynamically tuned coupled resonator network coupled to respective second terminals of the first and second devices through a tuning voltage network. The voltage controlled oscillator in accordance with this aspect of the present invention may further desirably comprise a dynamically tuned combiner network coupled between respective third terminals of the first and second devices, wherein the dynamically tuned combiner network combines signals present at the third terminals of the first and second devices into an output signal that is tunable over an octave frequency band.

Further in accordance with the aspect of the present invention, the voltage of the tuning network may be adjusted to tune the frequency of the output signal over the octave frequency band. It is also desirable that the tunable resonator network circuitry comprise a pair of micro-strip coupled resonators arranged in a horse-shoe configuration.

In accordance with yet another aspect of the present invention, an oscillator is provided. The oscillator preferably comprises a transistor arranged in a parallel emitter configuration and a resistance network coupled between a first terminal and a second terminal of the transistor. The resistance network is preferably capable of generating a negative resistance. The oscillator also further desirably includes a tuning voltage network coupled to the third terminal of the transistor through a coupled resonator network such that as the tuning voltage network is adjusted the operating frequency of the oscillator is tuned over a frequency band and the negative resistance generated is kept substantially uniform over the frequency band.

In accordance with yet another aspect of the present invention, a network communication device is desirably provided. The network communication device preferably comprises a phase lock loop for generating a clock signal used to transmit or recover information communicated from or to the device, wherein the phase lock loop includes a voltage controlled oscillator for generating the clock signal. The oscillator may further desirably comprise a first device having first, second and third terminals; a second device having first, second and third terminals; and circuitry comprising tunable coupled resonator networks coupled to the second terminals of each of the devices through a tuning voltage network, wherein the dynamically tuned combiner network combines signals present at the third terminals of the first and second devices into an output signal that is tunable over an octave frequency band.

In a further aspect, the present invention is a network communication device. The device preferably comprises a phase lock loop for generating a clock signal used to transmit or receive information communicated from or to the device. The phase lock loop preferably includes a voltage controlled oscillator comprising a three terminal device arranged in a parallel emitter configuration and a resistance network coupled between a first terminal and a second terminal of the device. The resistance network is preferably capable of generating a negative resistance. The oscillator also further desirably includes a tuning voltage network coupled to the third terminal of the device through a coupled resonator network such that as the tuning voltage network is adjusted the operating frequency of the oscillator is tuned over a frequency band and the negative resistance generated is kept substantially uniform over the frequency band.

In accordance with this aspect of the present invention, the voltage of the tuning network is preferably adjusted to tune the frequency of the output signal over the octave frequency band. It may further prove desirable in accordance with this aspect of the present invention, if the device comprises a wireless device including a cellular telephone or a personal digital assistant.

Further still, in accordance with an additional aspect of the invention, a voltage control oscillator comprising a first three terminal device and a second three terminal device is provided. Each three terminal device includes first, second and third terminals. The first terminal of each of the devices is preferably coupled together through a tunable phase coupling network. Each of the second terminals of the devices is coupled to respective dynamically tuned coupled-resonator networks, which are preferably coupled together through a tuning voltage network. Each of the third terminals of the devices are coupled to each other through a bias network, which is also coupled to the first terminal. A tunable output signal at the fundamental frequency of the circuit is tapped off each of the third terminals and preferably combined in a dynamically-tuned combiner network. A tunable output signal operating at twice the fundamental frequency of the circuit is desirably obtained at the output of the dynamically-tuned combiner network.

Further in accordance with this aspect of the present invention, the circuit elements of the voltage controlled oscillator are preferably selected such that the fundamental frequency of operation of the circuit is tunable over 1000 MHz to 2000 MHz. In accordance this preferred aspect, the tunable output signal is tunable over a frequency range of 2000 MHz to 4000 MHz.

The three terminal devices may each preferably comprise bipolar transmitters, although field effect transistors may also be used.

In accordance with a further aspect of the present invention, the circuit elements comprising the voltage control oscillator are preferably selected and arranged in accordance with FIG. 2. In yet another aspect, the present invention is a voltage controlled oscillator preferably implemented in accordance with the schematic diagram of FIG. 3. In yet another aspect, the present invention is a voltage controlled oscillator preferably implemented in accordance with the schematic diagram of FIG. 4.

In another aspect, the present invention comprises a voltage controlled oscillator having a three terminal bipolar transistor in a parallel-emitter configuration. The base terminal of the transistor is coupled to a wideband negative resistance generating network, which is coupled across the collector terminal of the transistor. A DC-bias and filtering network is also coupled to the collector terminal. Circuitry comprising a pair of coupled resonators and tuning diodes are preferably coupled across the emitter terminal of the device through a filtering and tuning voltage network. In accordance with this aspect of the present invention, an output signal is tapped from the collector terminal through a matching and output network. Further in accordance with this aspect of the present invention, the voltage controlled oscillator may be preferably implemented in accordance with FIG. 8. In addition, in accordance with this aspect of the present invention, the voltage controlled oscillator is preferably implemented or laid out in accordance with the schematic diagram shown in FIG. 9.

In accordance with yet another aspect of the present invention, a voltage controlled oscillator is provided. The oscillator preferably comprises a first three terminal device and a second three terminal device, each having a first, a second, and a third terminal. The first terminals of the devices are preferably coupled together through a tunable phase coupling network. In addition, the second terminal of each of the devices is coupled together through a tuning bias voltage network and respective dynamically tuned coupled resonator networks. The first and third terminals of each device are coupled together through respective bias networks. A tunable output operating at the fundamental frequency, based on the values of the elements comprising the circuitry, present at the collector of each of the devices is coupled through a second harmonic combiner network. An output signal tunable over a range twice the fundamental frequency of operation results at the output of the combiner network. In a most preferred embodiment the output signal is tunable over a range comprising 3000 MHz to 6000 MHz. Further in accordance with this embodiment, the voltage controlled oscillator is implemented in accordance with the circuit diagram of FIG. 11.

In another aspect, the present invention is a method for dynamically tuning an integrated coupled-resonator tuned network, negative resistance generating network, phase-coupling network and the second harmonic combiner network for the realization of an ultra low noise octave band voltage controlled oscillator. More particularly, the present invention discloses an innovative approach of dynamic tuning of a negative resistance-generating network, coupled-resonator tuning diode network, and $n^{th}$ harmonic combiner network (n=2) for ultra low noise octave band operation. This approach may be implemented using any three terminal device such as bipolar transistors and field-effect transistors or any other three terminal device that may be implemented in the future.

In another aspect, the present invention offers a cost effective and power efficient solution (5V, 10 mA) to the demand for a wideband oscillator, which is accomplished by dynamically tuning the transistor's stability factors and maintaining the time average loaded Q of the coupled resonator over the desired tuning band.

In accordance with a further aspect of the present invention, the coupled resonator and coupled oscillator topology opens up the door to the high frequency ranges and enables the realization of integrated silicon based systems operating at higher frequencies during wideband operation. Further in accordance with this aspect of the present invention the design, fabrication, and performance of a wideband voltage controlled oscillator that can satisfy the present demand for a low noise, wide tuning range, less harmonic content, manufacturing tolerance and miniaturization are provided.

Furthermore, the freedom of selection of the frequency-band of VCO implemented in accordance with the present invention, its compact size, low cost, low power consumption, and stability over the wide operating temperature range provides a technology that is attractive for mobile communication applications.

In accordance with a further aspect of the present invention the effects that may limit the wideband tuning range and development of unique topology, which can support octave-band tunability are reduced.

A further aspect of the present invention is a compact, power efficient, ultra low noise and low thermal drift microwave octave-band VCO operating, for example, at 1600 MHz, 2000 MHz, and 3000 MHz with more than 100% tunable bandwidth. The phase noise performance of a VCO implemented in accordance with this aspect of the present invention is usually at least −94 dBc @10 KHz, typically better than −100 dBc, for the frequency band of 1600-3200 MHz, −90 dBc/Hz@10 KHz, typically better than −95 dBc, for the frequency band of 2000-4000 MHz and −85 dBc/Hz@10 KHz, typically better than −90 dBc, for the frequency band of 3000-6000 MHz.

The present invention supports oscillations for more than octave band tenability without degrading the loaded Q of the circuit over the frequency band. A topology is desirably designed to increase the loaded time average quality factor over the frequency band by selecting an optimum coupling factor of the micro-stripline coupled-resonator structure.

In accordance with yet another aspect of the present invention, a system of coupled resonators is disclosed. The disclosed system advantageously enhances the time average loaded Q factor over the octave band. Application of this approach results in an integrated dynamically tuned-microstrip-coupled resonator based oscillator, which significantly improves the phase noise performance depending upon the coupling factor of the coupled resonator over the wideband range.

In addition, the basic topology is extended to a system of coupled voltage controlled oscillators for extending the frequency of operation of the dynamically tuned coupled resonator and this objective is accomplished by dynamically coupling the oscillator over the entire band in such a way that they mutually injection lock over the wideband (octave band).

With regard to the state of the art of the push-push/N-push oscillator, the present invention provides the general implementation of an octave-band dynamically tuned tunable coupled oscillator for an extended frequency range of operation.

The topology and circuitry of the various aspects of the present invention are desirably able to maintain the noise performance over a wide temperature range (−40° C. to +85° C. throughout the octave-band of operation and the structure of the layout remains substantially the same for other higher frequency bands.

The foregoing and other aspects of the present invention preferably include a topology, which provides constant negative resistance over octave-band; a tuning arrangement for wideband tunability without degrading the loaded Q of the tuning network over the octave-band; a coupled-resonator structure, which will support resonance over an octave-band; the optimum size ($I_{cmax}/I_{dss}$) of the bipolar or FET for low phase noise; a coupled-oscillator/N-Push approach for improvement in phase noise; a second harmonic combiner circuit; a dynamically tuned phase coupling network.

DESCRIPTION OF THE PREFERRED EMBODIMENTS

In one aspect, the present invention relates to circuitry for voltage controlled oscillators (VCOs). Preferably, such oscillators have one or more of the following characteristics: ultra-low phase noise performance, power efficient, low cost, tunable with more than octave-band tunability and amenable to integrated chip form.

Figure 1:
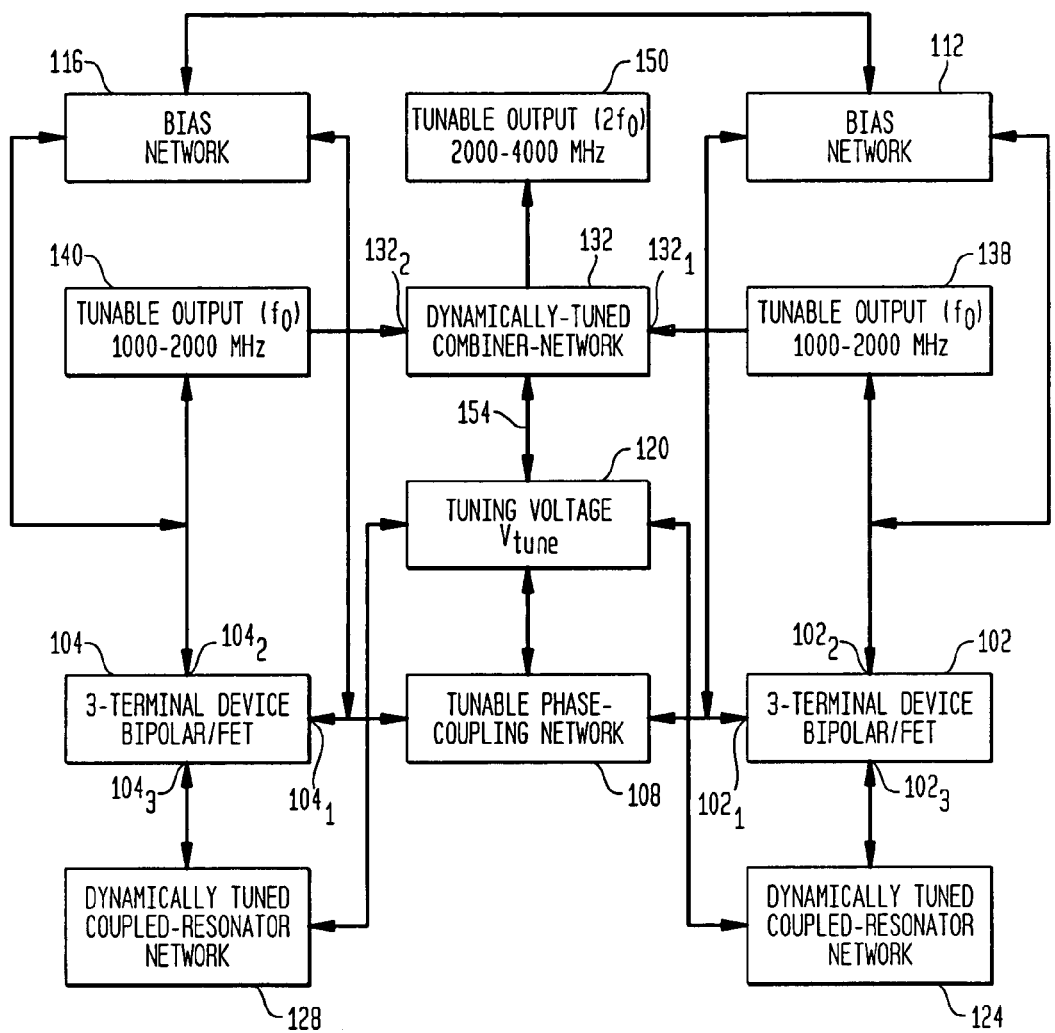
FIG. 1 is a functional block diagram illustrating the modules of a voltage controlled oscillator (VCO) in accordance with an aspect of the present invention.

FIG. 1 illustratively depicts a functional block diagram of the modules of a low noise octave-band voltage controlled oscillator (VCO) 100 in accordance with an aspect of the present invention. The VCO 100 is shown as operating in the frequency range of 1000-2000 MHz/2000-4000 MHz (i.e., 1 GHz-2 GHZ/2 GHz-4 Ghz), although the individual circuit parameters, e.g., resistor values, capacitor values, etc., may be selected and arranged so that the circuit operates at a different fundamental frequency and produces a tunable output at both the fundamental frequency and second harmonic. In addition, the topology shown in FIG. 1 may be extended from a push-push type configuration, such as 1 GHz-2 GHz/2 GHz-4 GHz/4 GHz-8 GHz/8 GHz-16 GHz, which allows the operating frequency of the oscillator to be extended beyond the cut-off frequency of the active device.

As FIG. 1 shows, the VCO/oscillator 100 includes a pair of three terminal devices, 102 and 104, which are coupled together through the other modules shown. More particularly, each device 102 and 104 includes three terminals, illustrated as $102_1$, $102_2$ and $102_3$ and $104_1$, $104_2$ and $104_3$, respectively. The first terminal $102_1$, of first device 102 is coupled to a tunable phase coupling network 108 and bias network 112. The tunable phase coupling network 108 is also coupled to the first terminal $104_1$ of the second device 104, which is also coupled to a bias network 116 at terminal $104_1$. The tunable phase coupling network 108 is also coupled to tuning voltage block 120. The tuning voltage block 120 is coupled to dynamically tuned coupled-resonator networks, 124, 128, which are respectively coupled to the third terminals $102_3$, $104_3$ of each of the three terminal devices.

As discussed in U.S. application Ser. No. 10/912,209, the disclosure of which is incorporated by reference herein, the terminal devices preferably comprise a bipolar transistor and wherein the first, second and third terminals of the three terminal device comprise either the collector, base and emitter nodes of the bipolar transistor. On the other hand, the three terminal device may comprise a field effect transistor wherein the first, second and third terminals of the three terminal device either comprise the collector, base and emitter nodes of the field effect transistor. As a general matter, the three terminal device desirably includes any three terminal device which is operable to provide a 180 degree phase shift between the first and second terminals.

The tuning voltage block 120 is further coupled to a dynamically-tuned combiner network 132, which includes two input ports, $132_1$ and $132_2$. Each of the input ports $132_1$ and $132_2$ accepts input signals 138, 140 present at the second terminals $102_2$ and $104_2$ of each of the devices. The dynamically-tuned combiner network 132 combines the input signals 138, 140 and produces a signal 150 operating at the second harmonic of the input signals 138, 140.

The oscillator 100 preferably operates in the following manner. The circuit elements comprising the various modules, e.g., diodes, resistors, capacitors, resonators, etc., are selected so that each of the three terminal devices 102, 104 oscillate at a fundamental frequency, f0. As the voltage level of the tuning voltage module 120 is adjusted the fundamental frequency of operation, f0, appearing as input signals 138, 140, is tuned over the operating range of the oscillator, e.g., preferably octave-band. These signals 138, 140 are then combined in the combiner network 132 to produce a signal operating at twice the fundamental frequency, 2f0, and that is dynamically tuned as the voltage level of the tuning voltage module 120 is adjusted. A select portion of a signal 154 from the combiner network 132 is also fed back to the tuning block 120. A portion of the signal 154 is then fed to tunable phase coupling network 108 and used to dynamically tune the phase of the output signals 138, 140, so that each of these signals remains in phase during a tuning operation. In addition, a portion of the signal 154 is also fed to each of the dynamically-tuned coupled resonator networks 124, 128, so that the frequency, f0, present at block 138 is at the same frequency as the signal present at block 140. Accordingly, as the tuning voltage, Vtune, is adjusted the frequency of the signals, f0, present at each of the terminals $102_2$ and $104_2$ is tuned over the operating frequency band through the coupled resonator networks 124, 128, while the phase coupling network 108 keeps the two devices 102, 104 operating in an anti-phase mode at the fundamental frequency, f0 (e.g., push-pull behavior), while the second harmonic, 2f0, interferes constructively (e.g., push-push behavior) over the octave band.

Figure 2:
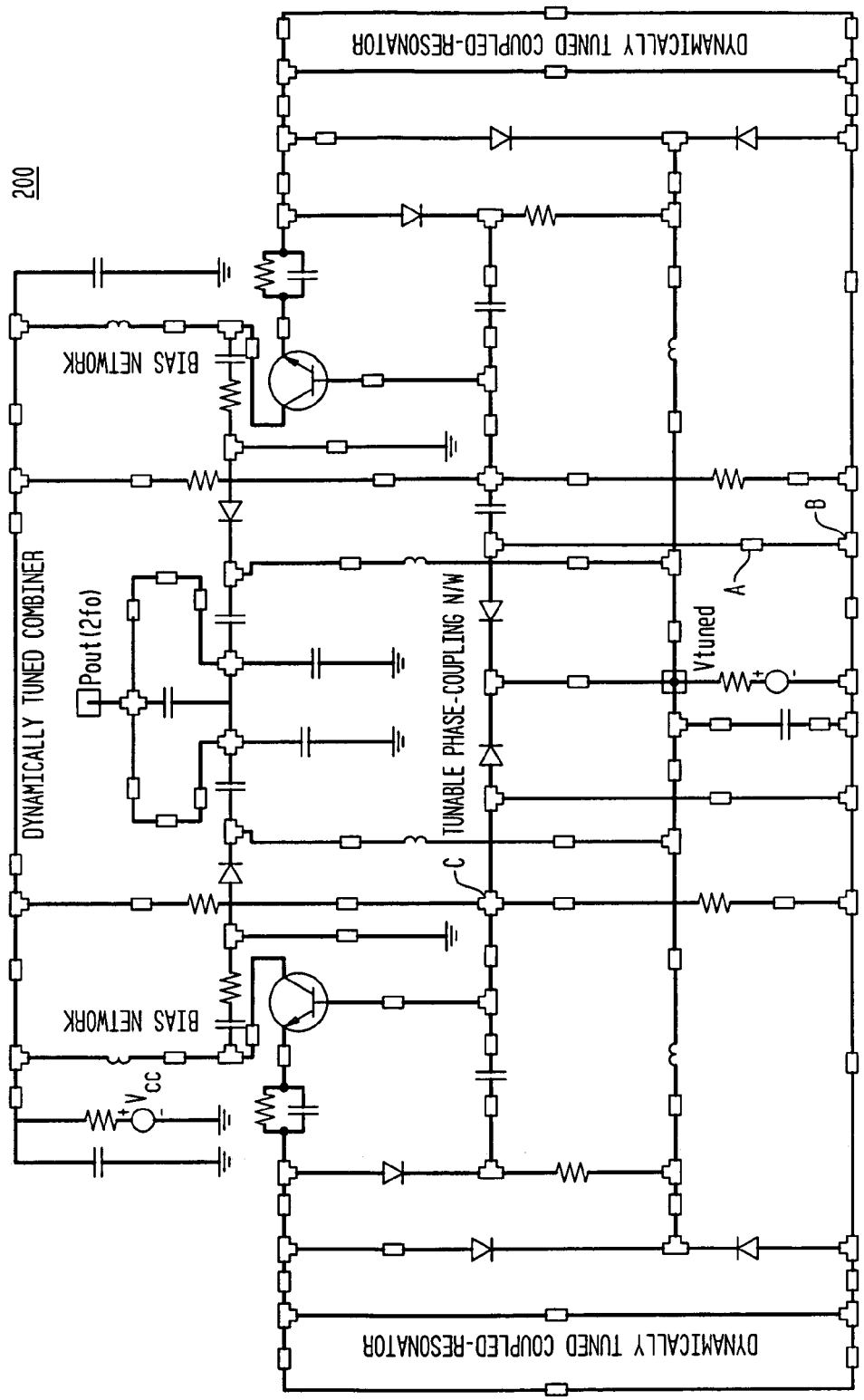
FIG. 2 is a schematic circuit diagram of a VCO in accordance with an aspect of the present invention.

FIG. 2 depicts a schematic circuit diagram 200 of a VCO designed in accordance with the principles of FIG. 1 in accordance with an additional aspect of the present invention. In particular, FIG. 2 illustrates a dynamically tuned coupled-resonator network, dynamically tuned phase-coupling network and dynamic tuned combiner network for octave-band 2-Push/Push-Push operation. As one of ordinary skill in the art may recognize, the rectangular blocks (e.g., A) in FIG. 2 (and the other circuit diagrams that comprise this disclosure) are transmission lines and coupling blocks (e.g., B or C) are three port (T-connector) or four port connecters or couplers that connected different circuit branches. Although FIG. 2 shows a 2-Push configuration the circuitry may be extended to an N-Push configuration and provide a tunable signal at N times the fundamental frequency of the sub-circuit's operation. The sub-circuits comprise the respective bias networks, resonator networks and three-terminal devices, which in this embodiment are depicted as bipolar transistors although FETs may be used also. The values of the individual circuit elements may be chosen so that the resulting output signal from the circuitry operates in the L, S and C band and is tunable over a desired frequency band, preferably octave-band. This configuration is intended to overcome the limitations of the fixed frequency operation of the push-push oscillator/N-push oscillator by including a tuning and phase controlling network over the desired frequency band (preferably octave-band).

Figure 3:
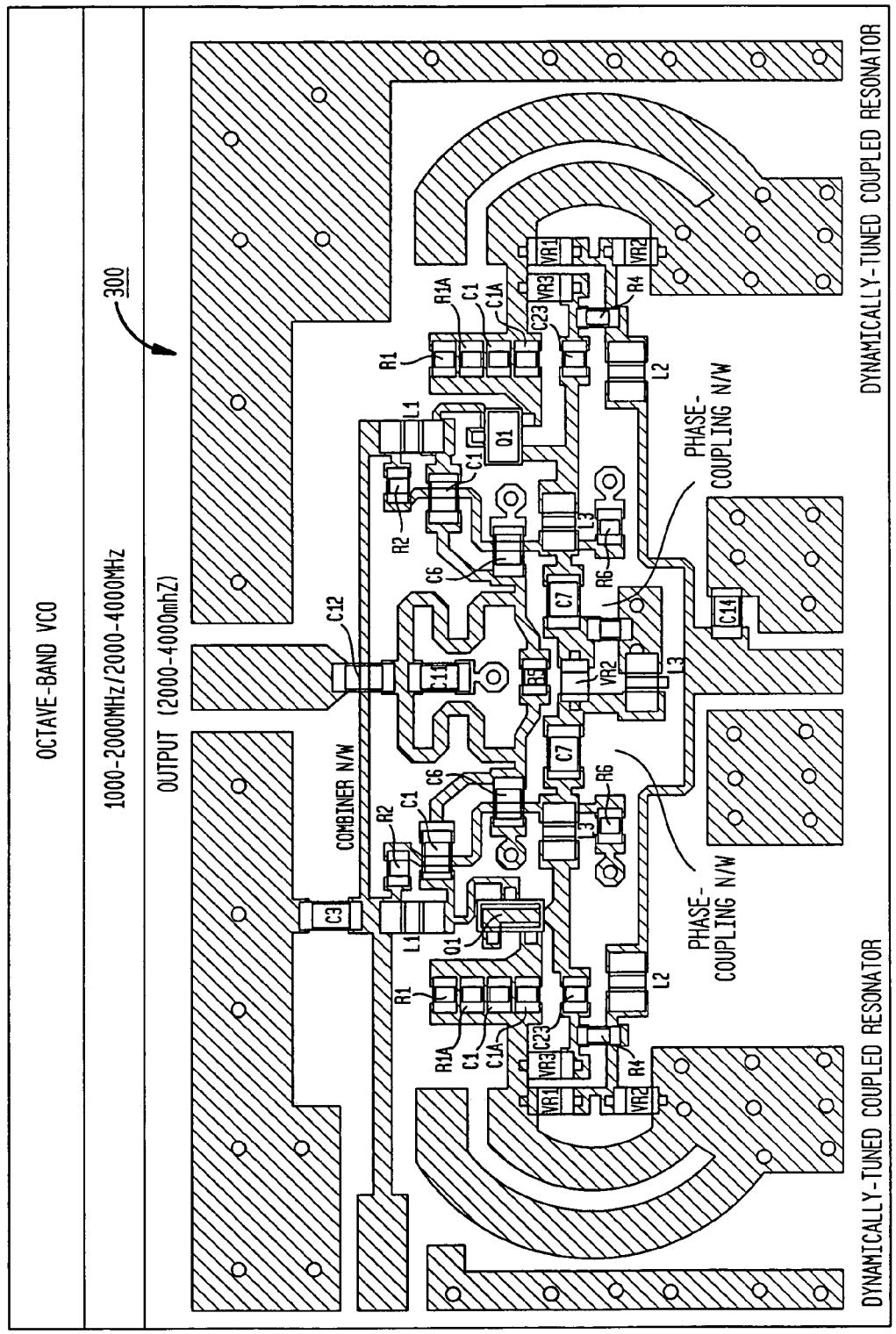
FIG. 3 is a schematic of an integrated circuit comprising a VCO in accordance with an aspect of the present invention.

FIG. 3 illustrates a schematic layout of an integrated circuit (IC) 300 designed in accordance with the schematic circuit diagram of FIG. 2 with the values of the various circuit elements chosen such that the fundamental frequency is tunable over the frequency range of 1000 MHz to 2000 MHz (1 GHz to 2 GHz). In addition, the circuitry 300 also provides an output that is tunable over the frequency range of 2000 MHz to 4000 MHz (2 GHz to 4 GHz). As FIG. 3 shows the functional diagram of FIG. 1 and the circuitry of FIG. 2 are amenable to implementation as an integrated circuit. More particularly, the integrated circuitry of FIG. 3 includes a printed microstripline resonator and various discrete elements that may be preferably implemented in Roger material.

Figure 4:
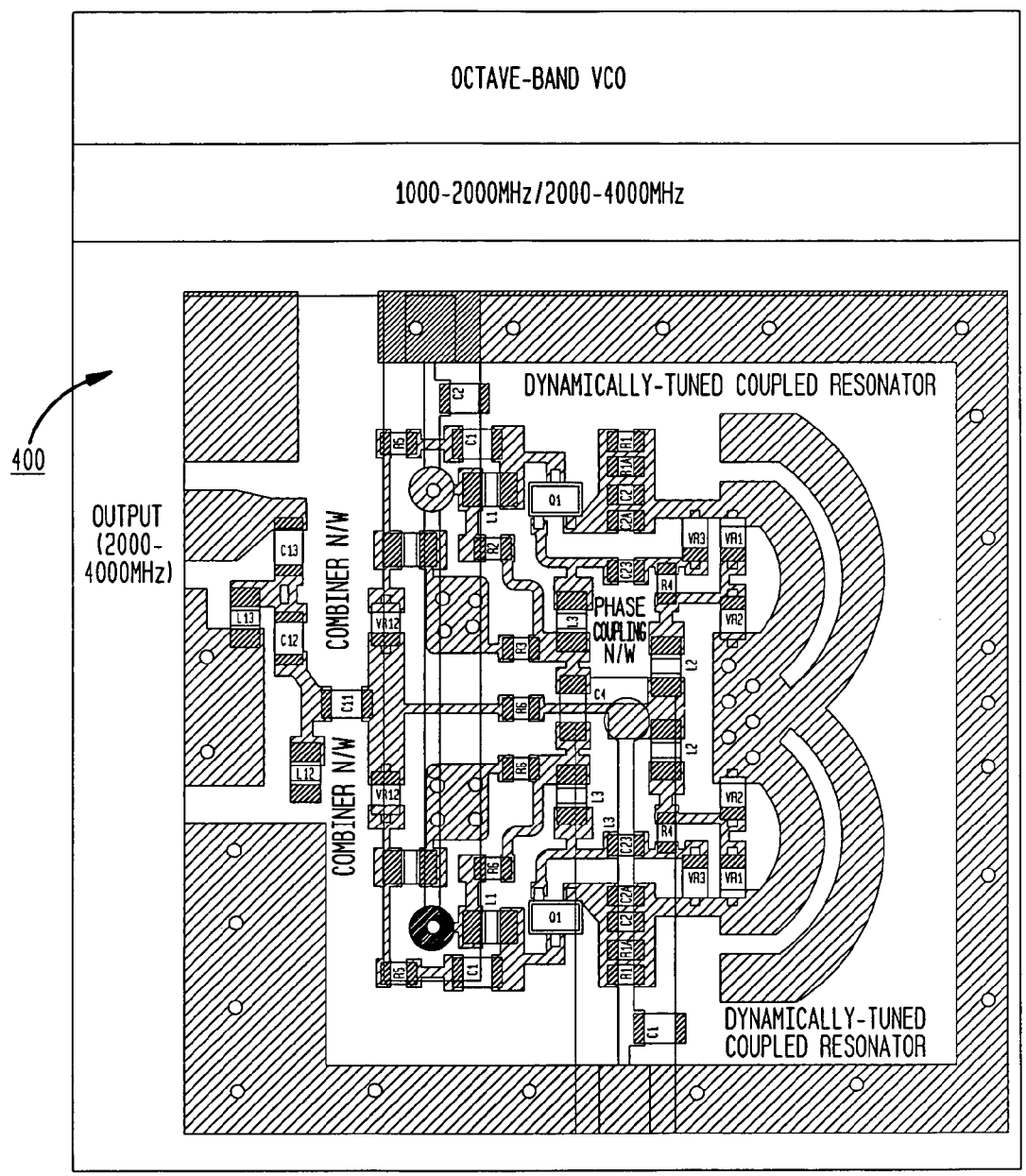
FIG. 4 is a schematic of an integrated circuit comprising a VCO in accordance with an aspect of the present invention.

FIG. 4 illustrates a schematic layout of another integrated circuit 400 in accordance with the schematic circuit diagram of FIG. 2. As in FIG. 3, the various components of FIG. 2 are chosen such that the fundamental frequency is tunable over the frequency range of 1 GHz to 2 GHz. In addition, the integrated circuit 400 also provides an output that is tunable over the frequency range of 2 GHz to 4 GHz. In accordance with this aspect of the present invention, the sub-circuits of each of the resonators are configured in a push-push topology and each of the dynamically tuned coupled resonators is provided in integrated circuit form. The form of the integrated circuit shown in FIG. 4 tends to be even more compact than that shown in FIG. 3.

As FIGS. 3 and 4 demonstrate a VCO designed in accordance with the foregoing aspects of the present invention may be implemented in the form of a compact integrated circuit, such as integrated circuits 300 and 400. The integrated circuits 300 and 400 may be advantageously mounted to a printed circuit or wire board in wireless devices, such as cell phones or a personal digital assistant, where space is at a premium. In addition, these devices preferably include octave band tunability, which allows for their deployment in applications such as WCDMA.

Figure 5:
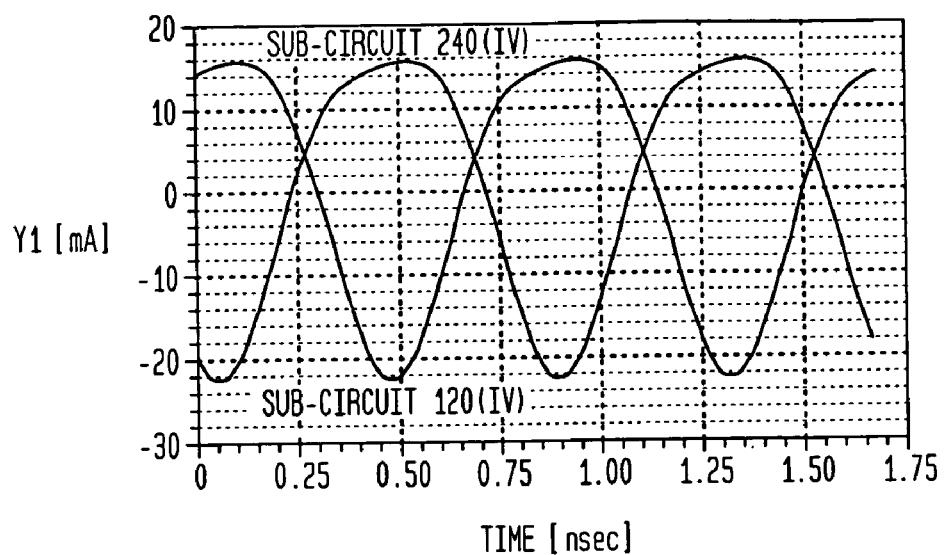
FIG. 5 is a plot of RF-base currents of the sub-circuits of FIG. 3 at the fundamental frequency of operation.

FIG. 5 illustrates a plot 500 of the RF-base currents of a voltage control oscillator of the type shown in FIG. 3 or 4 at the fundamental frequency of operation. As FIG. 5 shows, the RF-base currents are out of phase for the fundamental frequency of the operation, 1000-2000 MHz.

Figure 6:
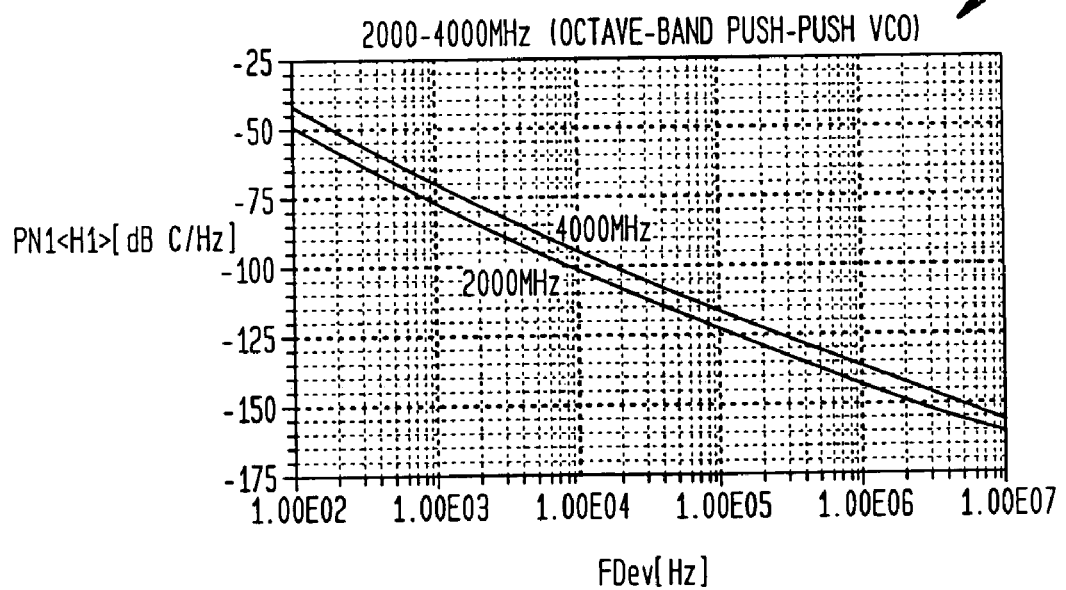
FIG. 6 shows a phase noise plot for a VCO over an octave-band frequency range of 2 GHz to 4 GHz in accordance with an aspect of the present invention.

FIG. 6 illustrates a typical phase noise plot 600 of an oscillator implemented in accordance with the circuitry illustrated in FIGS. 2, 3 or 4 for the octave-band frequency range of 2000-4000 MHz. As FIG. 6 shows the phase noise of the oscillator is approximately −90 dBc/Hz at 10 KHz over for the frequency band of 2000-4000 MHz. However, the integrated circuits 300, 400 typically provide better than −95 dBc/Hz at 10 KHz over for the frequency band of 2000-4000 MHz.

Figure 7:
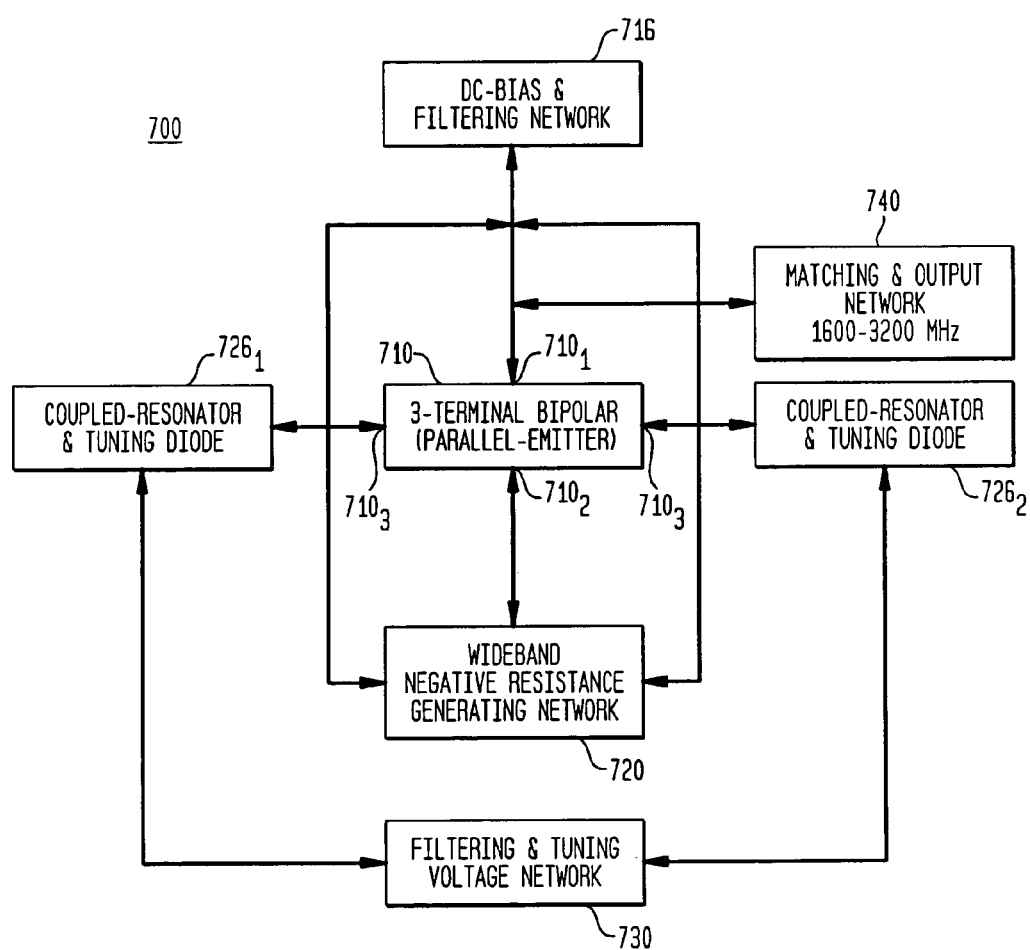
FIG. 7 is a functional block diagram illustrating the modules of a VCO in accordance with an aspect of the present invention.

FIG. 7 is a functional block diagram illustrating the modules of a low noise octave-band VCO 700 in accordance with an additional aspect of the present invention. As shown in FIG. 7, the VCO includes a three terminal device 710 that includes terminals $710_1$, $710_2$ and $710_3$. The device 710 is preferably configured as a parallel emitter transistor. The first terminal $710_1$ is coupled to a DC-bias and filtering network 716. The second terminal $710_2$ is coupled to a wideband negative resistance network 720, which is also coupled to the first terminal $710_1$ of the device 710. The third terminal $710_3$ of the device 710 is coupled to a pair of dynamically tuned coupled-resonator tuning diode networks $726_1$ and $726_2$ preferably through the parallel emitter of a three-terminal bipolar transistor. In FIG. 7, the third terminal $710_3$ is shown twice on the device in order to simplify the diagram, yet while illustrating the parallel emitter configuration. A filtering and tuning voltage network 730 is coupled between the dynamically tuned coupled-resonator tuning diode networks $726_1$ and $726_2$. The output signal of the VCO 700 is taken from a matching and output network 740 coupled to the first terminal $710_1$ of the device.

In operation, the wideband negative resistance generating network 720 maintains a constant resistance over the tuning band of the oscillator 700. More particularly, the filtering and tuning network 730 is tuned to adjust the oscillation frequency of the device 710 through the coupled-resonator and tuning diode 726. As tuning occurs the negative resistance generating network 720 maintains uniform or constant negative resistance over the tuning band. In this way, the phase noise output of the oscillator may be maintained at a relatively low, e.g., ultra-low, level.

Figure 8A:
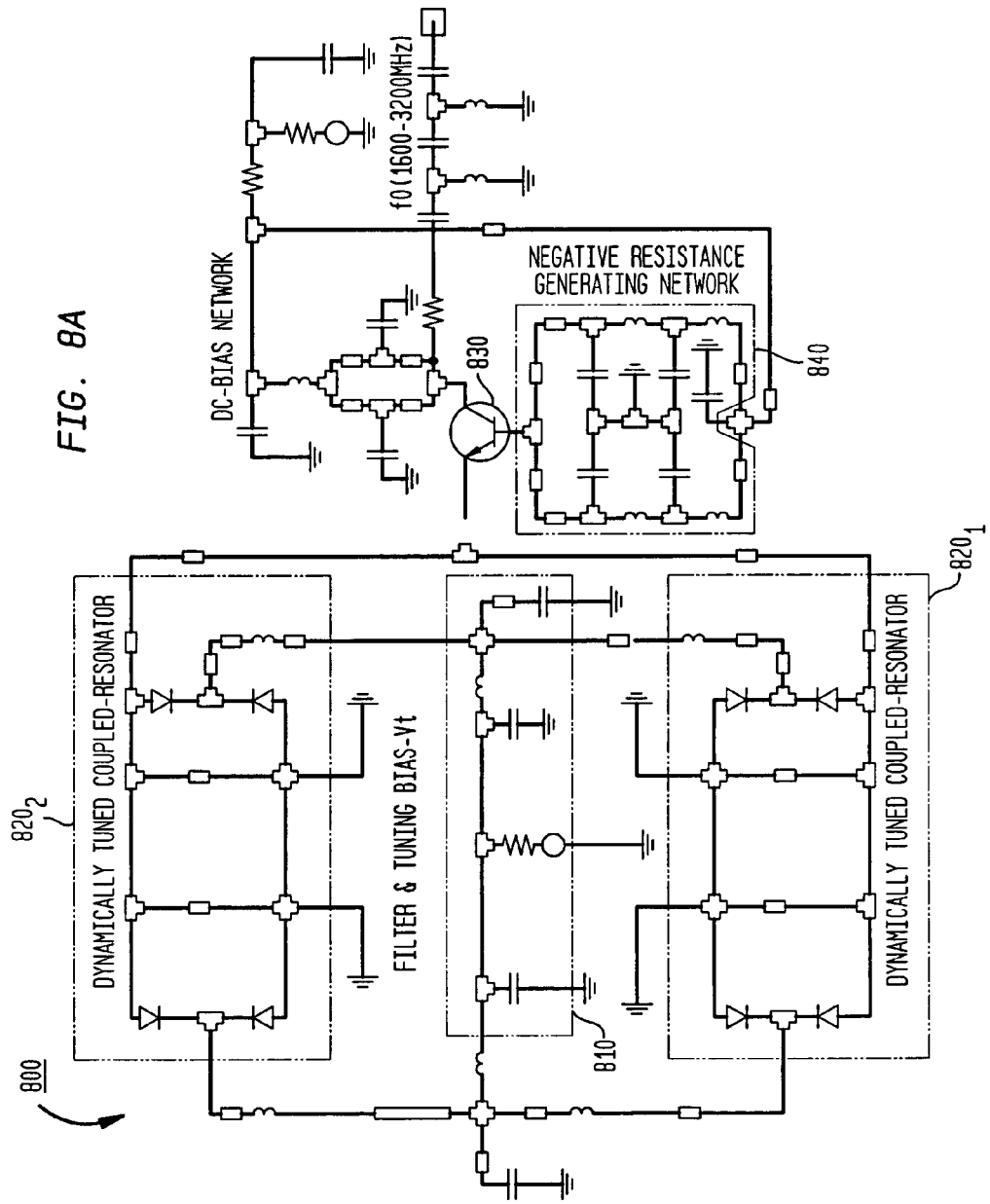
FIG. 8A is a schematic circuit diagram of a VCO in accordance with an aspect of the present invention.

FIG. 8A shows a schematic circuit diagram 800 of a possible implementation of the functional diagram 700 of FIG. 7 in accordance with another aspect of the present invention. As FIG. 8A shows, a filter and tuning bias network 810 is integrated with a pair of coupled horse-shoe microstrip resonator ($820_1$ and $820_2$). The tuning network 810 and negative resistance generating network 840 allows the VCO to be tunable over more than an octave-band while maintaining a uniform phase-noise performance through the band. The circuit elements are preferably chosen to provide tunability over a 1600-3200 MHz frequency band. The circuit elements may also be chosen to allow for tunability over other octave bands as is discussed below.

Figure 8B:
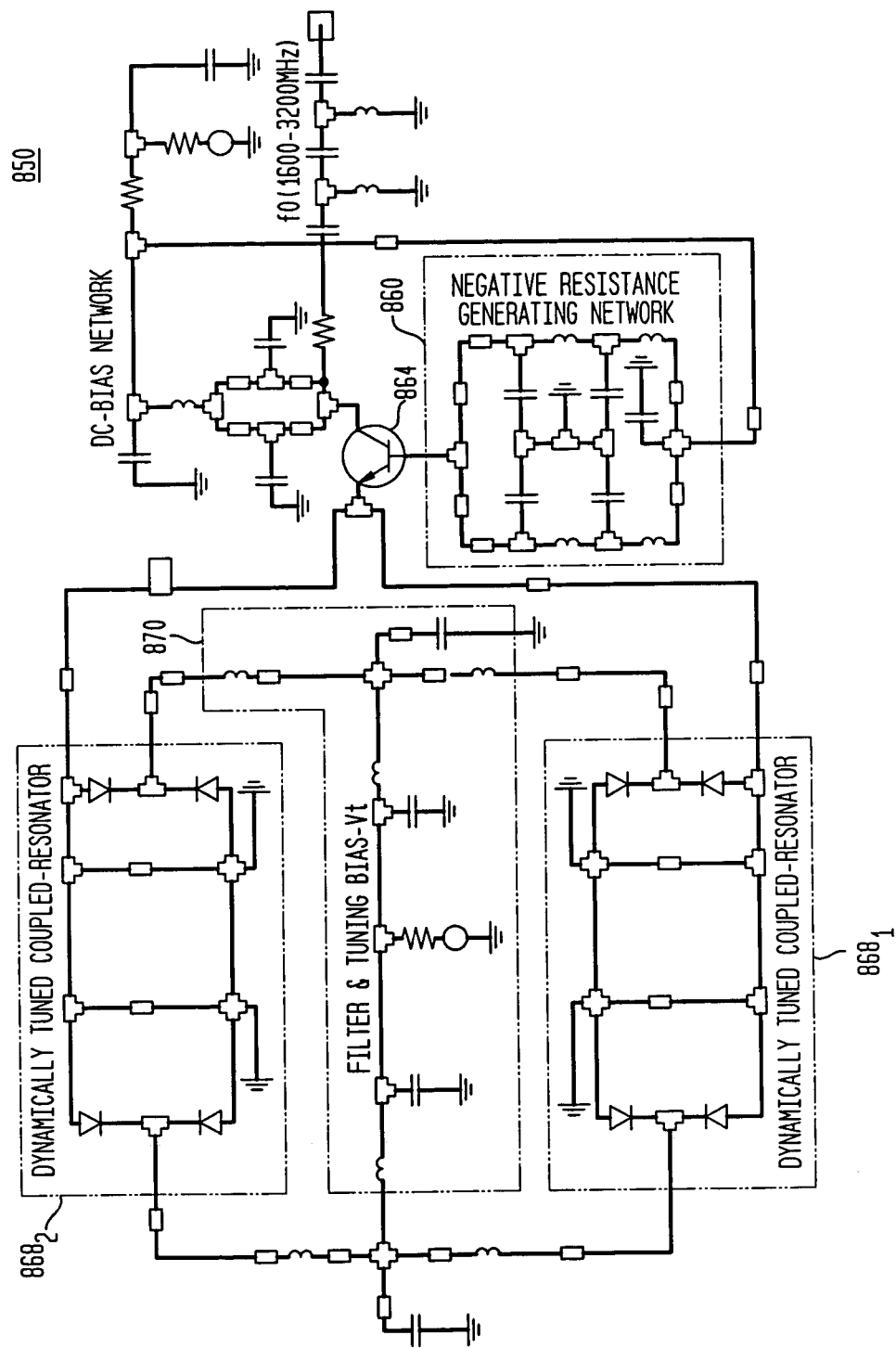
FIG. 8B is a schematic circuit diagram of a VCO in accordance with an aspect of the present invention.

FIG. 8B illustrates a schematic circuit diagram 850 of a possible implementation of the functional diagram 700 of FIG. 7. The circuitry 850 of FIG. 8B includes a variable negative resistance generating network 860, which is preferably coupled to the base of a bipolar transistor 864. The transistor 864 is preferably arranged in a parallel emitter configuration with a pair of dynamically tuned coupled-resonators $868_1$, $868_2$ coupled in parallel to the emitter. A filter and tuning bias network 870 is coupled between the resonators $868_1$ and $868_2$ as shown. The negative resistance generating network includes a pair a variable capacitors that allow the negative resistance to be variable over the tuning range. This in turns allows the value of resistance provided by the network 860 to be tunable over the tuning range of the oscillator.

Figure 9:
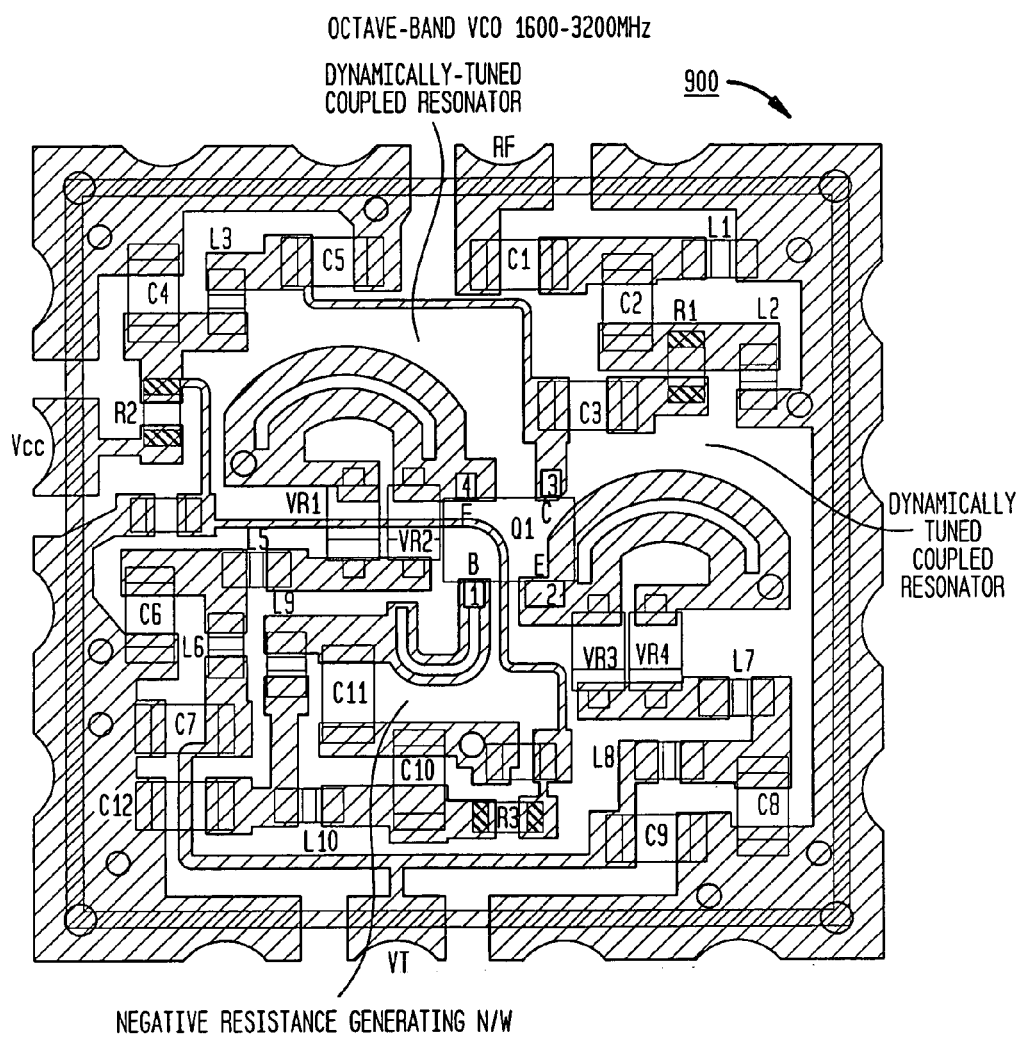
FIG. 9 is a schematic of an integrated circuit comprising a VCO in accordance with an aspect of the present invention.

FIG. 9 illustrates a schematic layout of an integrated circuit 900 designed in accordance with the embodiment illustrated FIG. 8A. The discrete elements and layout of the integrated circuit of FIG. 9 may be chosen to allow for more than octave band tunability over a 1.6 to 3.2 GHz operating frequency range.

Figure 10:
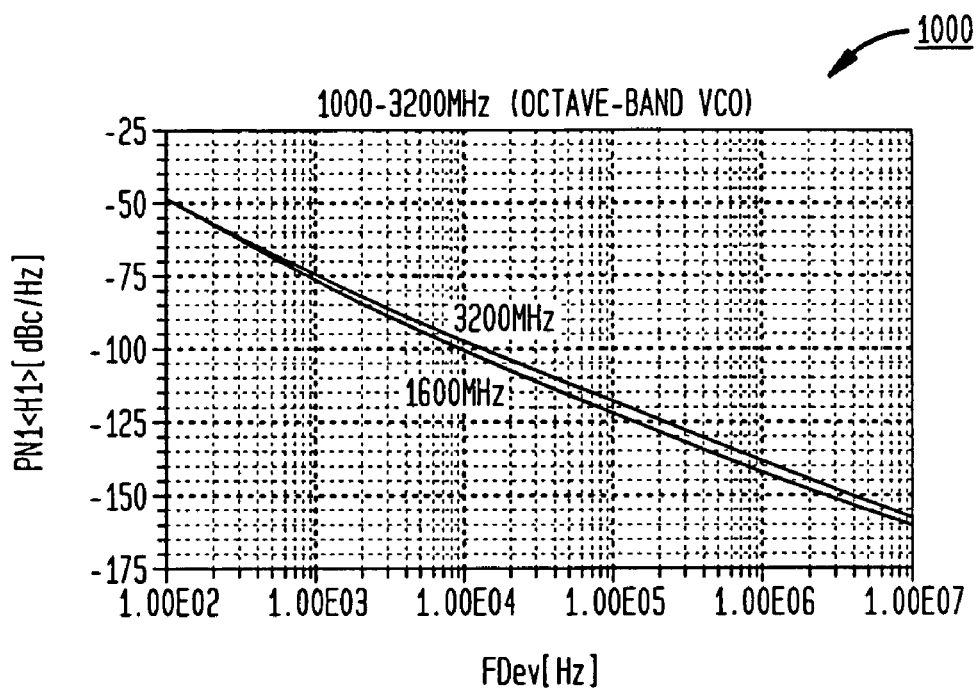
FIG. 10 illustrates a phase noise plot for the octave-band frequency range of a VCO in accordance with an aspect of the present invention.

FIG. 10 shows a phase noise plot 1000 for the octave-band frequency range of 1600-3200 MHz for the integrated circuit 900 of FIG. 9. As shown, the phase noise is approximately −95 dBc at 10 KHz, however the phase noise is typically better than −100 dBc at 10 KHz.

Figure 11:
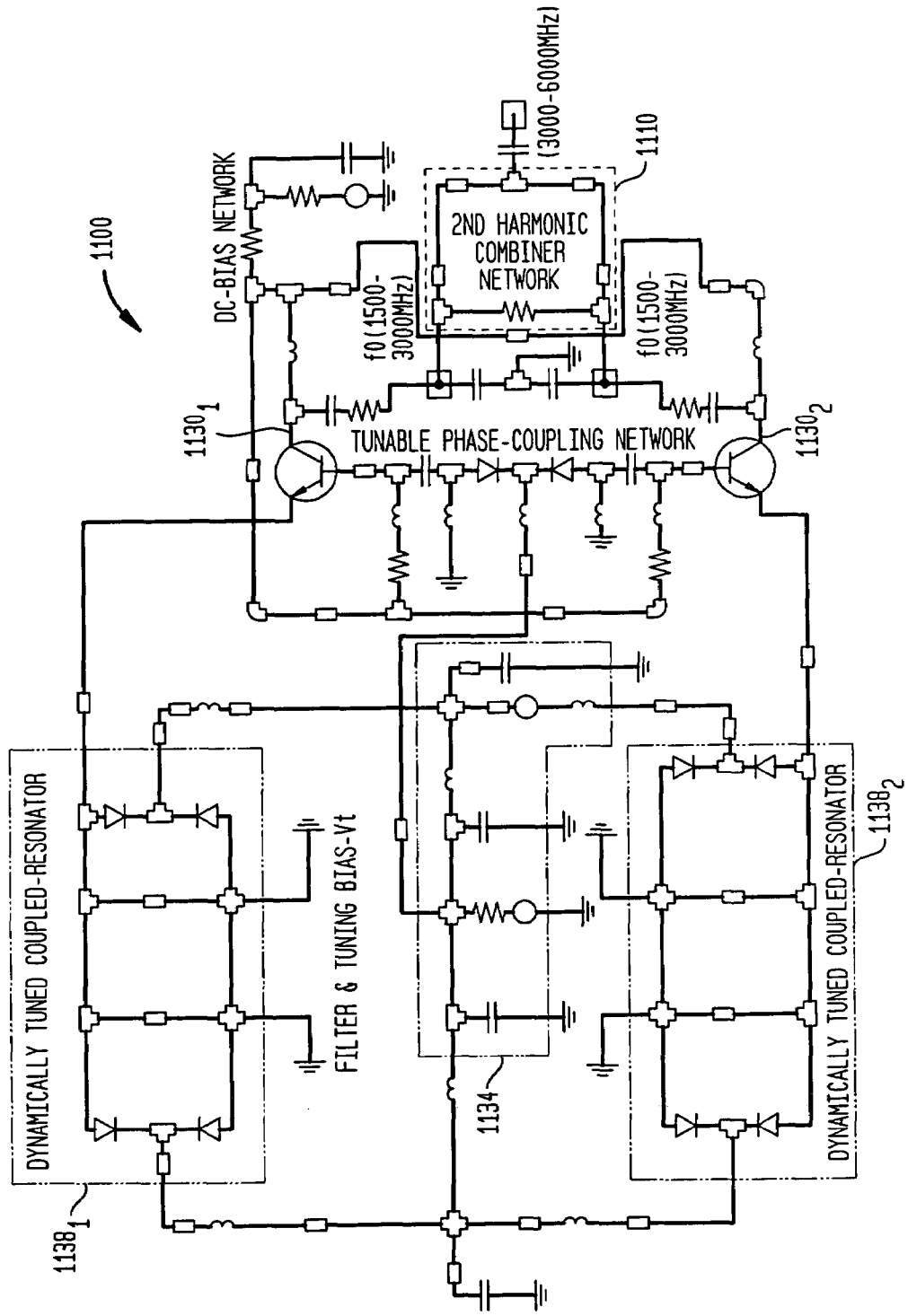
FIG. 11 is a schematic circuit diagram of a VCO in accordance with an aspect of the present invention.

FIG. 11 depicts a schematic circuit diagram of a low noise octave band VCO 1100 operating in the frequency range of 3000-6000 MHz in accordance with an additional aspect of the present invention. The circuit diagram of FIG. 11 is implemented in accordance with the functional diagram of the FIG. 1, however the circuit elements comprising the various modules are selected so as to provide a fundamental frequency of operation of 1500 to 3000 MHz. Accordingly, the second harmonic combiner network 1110 combines the signal at the fundamental frequency produced at the collectors, 1130$_1$ and 1130$_2$, of the transistors to produce a signal that is tunable over the frequency band of 3000 to 6000 MHz.

As FIG. 11 also shows, a dynamic tuning network 1134 which is integrated with coupled horse-shoe microstrip resonators 1138$_1$ and 1138$_2$ is incorporated to get more than octave band tunability while maintaining a uniform phase noise performance throughout the band.

Figure 12:
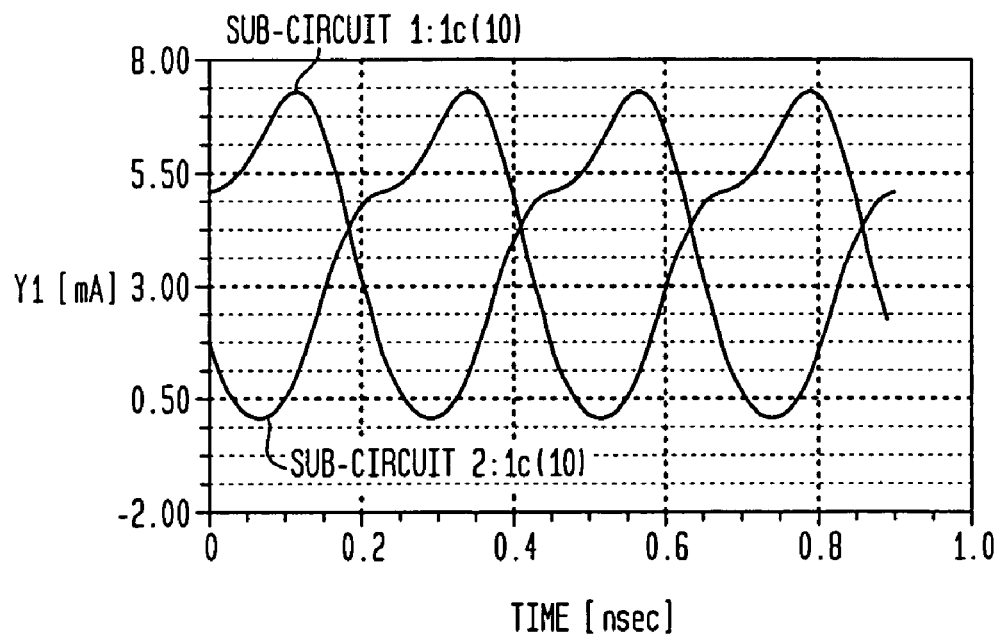
FIG. 12 is a plot of the RF-collector current of the circuitry depicted in FIG. 12.

FIG. 12 is a plot 1200 of the RF-collector current of both sub-circuits of FIG. 11, which are out of phase for the fundamental frequency of operation, 1500-3000 MHz.

Figure 13:
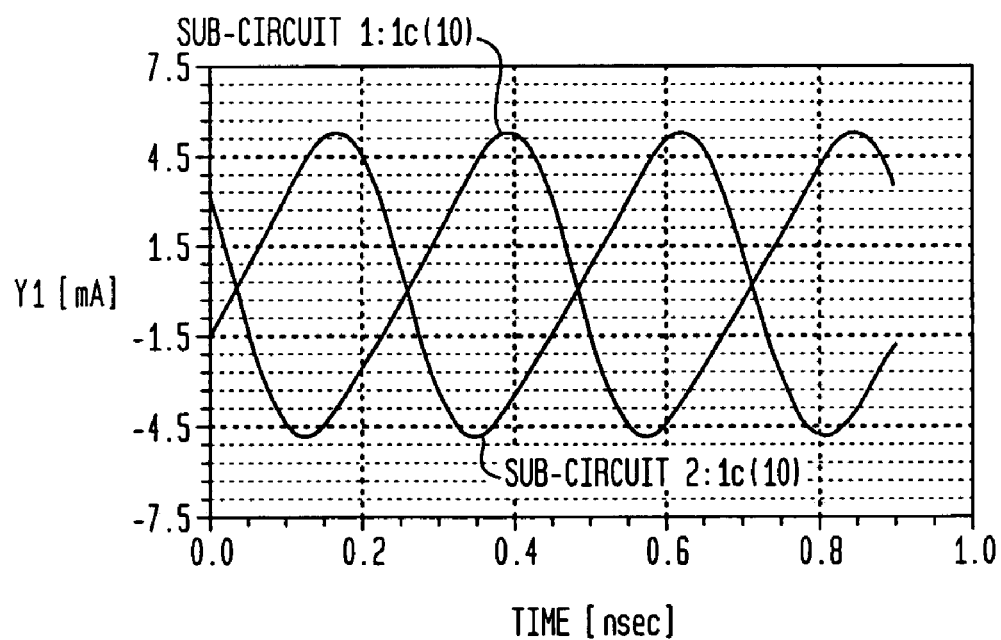
FIG. 13 is a plot of the RF-collector current of the circuitry depicted in FIG. 12.
Figure 14:
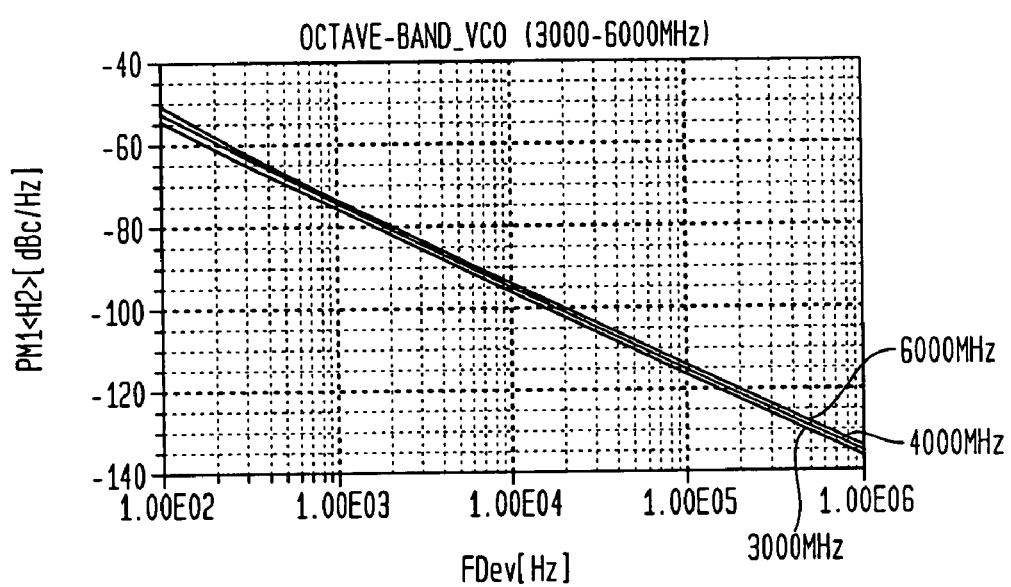
FIG. 14 illustrates a phase noise plot over an octave-band frequency range of 1.6 GHz to 3.2 GHz.

FIG. 13 is a plot 1300 of the RF-base currents of both sub-circuits of FIG. 11, which are out of phase for the fundamental (undesired frequency of the operation), 1500-3000 MHz. FIG. 14 shows a phase noise plot 1400 for octave-band frequency range of 3000-6000 MHz for the circuitry shown in FIG. 11.

A voltage controlled oscillator implemented in accordance with the present invention may be employed in any number of devices that are used to communicate on data, telephone, cellular or, in general, communications network. Such devices may include but are not limited to, for example, cellular phones, personal digital assistants, modem cards, lap tops, satellite telephones. As a general matter, the oscillator circuitry shown in the various drawings and described above may be employed in a PLL to either generate a clock signal that may be used to transmit or recover information transmitted or received over a network. In addition to wireless networks, the circuitry of the present invention may be employed in wired networks, satellite networks, etc.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A voltage controlled oscillator, comprising:
   a first device having first, second and third terminals;
   a second device having first, second and third terminals, the first device and second device being coupled in a push-push configuration;
   circuitry for a tunable phase coupling network coupled between respective first terminals of the first device and the second device, the circuitry comprising at least two diodes;
   circuitry comprising one or more tunable coupled resonator networks coupled to the third terminals of each of the devices through a tuning voltage network; and
   a dynamically tuned combiner network coupled between respective first terminals of the first and second devices,
   wherein the voltage of the tuning network can be adjusted to tune a frequency of an output signal generated by said dynamically tuned combiner network over at least an octave frequency band.

2. The voltage controlled oscillator of claim 1, further comprising a bias network coupled between the first and second terminals of the first and second devices.

3. The voltage controlled oscillator of claim 1, further comprising a dynamically tuned combiner network coupled between the first terminals of each of the devices to combine signals present at the first terminals into an output signal tunable over an operating frequency range that is twice the fundamental frequency.

4. The voltage controlled oscillator of claim 1, wherein the first and second devices each comprise bipolar transistors in which the first, second and third terminals respectively comprise the collector, base and emitter terminals of the bipolar transistors.

5. The voltage controlled oscillator of claim 1, wherein the first and second devices each comprise field effect transistors in which the first, second and third terminals respectively comprise the source, gate and drain terminals of the transistors.

6. The voltage controlled oscillator of claim 1, wherein the tunable resonator networks comprise a pair of microstrip coupled resonators arranged in a horse-shoe configuration.

7. The voltage controlled oscillator of claim 1 wherein the first device, second device and circuitry are implemented in an integrated circuit.

8. The voltage controlled oscillator of claim 7, wherein the circuitry further comprises two or more micro-stripline resonators formed on the integrated circuit.

9. The voltage controlled oscillator of claim 7, wherein the integrated circuit is formed on a printed circuit board.

10. A voltage controlled oscillator, comprising:
    a first three-terminal device and a second three-terminal device coupled to each other in a push-push configuration;
    circuitry for a tunable phase coupling network coupled between respective first terminals of the first device and second devices;
    circuitry for a dynamically tuned coupled resonator network coupled to respective third terminals of the first and second devices through a tuning voltage network; and
    a dynamically tuned combiner network coupled between respective first terminals of the first and second devices, and
    wherein the dynamically tuned combiner network combines signals present at the first terminals of the first and second devices into an output signal tapped from the first terminals of the first and second devices and that is wideband tunable.

11. The voltage controlled oscillator of claim 10, wherein the voltage of the tuning network can be adjusted to tune the frequency of the output signal over the octave frequency band.

12. The voltage controlled oscillator of claim 11, wherein the first and second three-terminal devices each comprise bipolar transistors.

13. The voltage controlled oscillator of claim 11, wherein the first and second devices each comprise field effect transistors.

14. The voltage controlled oscillator of claim 10, wherein the tunable resonator network circuitry comprise a pair of micro-strip coupled resonators arranged in a horse-shoe configuration.

15. The voltage controlled oscillator according to claim 1, wherein the dynamically tuned combiner network is configured to generate an output frequency being twice a fundamental frequency of the first and second devices, and the output is dynamically tuned as a voltage level of the circuitry comprising one or more tunable coupled resonator networks is adjusted.

16. A network communication device, the device comprising:
- a phase lock loop for generating a clock signal used to transmit or recover information communicated from or to the device,
- wherein the phase lock loop includes a voltage controlled oscillator for generating the clock signal, the voltage controlled oscillator comprising,
- a first transistor having first, second and third terminals;
- a second transistor having first, second and third terminals;
- circuitry for a tunable phase coupling network coupled between respective first terminals of the first transistor and the second transistor;
- a pair of tunable coupled resonator networks coupled to the third terminals of each of the transistors through a tuning voltage network, the first transistor and second transistor being arranged in a push-push configuration; and
- a dynamically tuned combiner network coupled between respective first terminals of the first and second transistors,
- wherein the voltage of the tuning network can be adjusted to tune an output signal generated by said dynamically tuned combiner network.

17. The voltage controlled oscillator of claim 16, further comprising a bias network coupled between the first and third terminals of the first and second transistors.

18. The voltage controlled oscillator of claim 16, further comprising a dynamically tuned combiner network coupled between the first terminals of each of the transistors to combine signals present at the first terminals into an output signal tunable over an operating frequency range that is approximately twice the fundamental frequency.

19. The communication device of claim 16, wherein the communication device comprises a wireless device.

20. The communication device of claim 19, wherein the wireless device is a cellular telephone.

21. The communication device of claim 19, wherein the wireless device is a personal digital assistant.

22. The network communication device according to claim 16, wherein the dynamically tuned combiner network is configured to generate an output frequency being twice a fundamental frequency of the first and second transistors, and the output is dynamically tuned as a voltage level of the pair of tunable coupled resonator networks is adjusted.

23. A telephone, comprising:
- a phase lock loop for generating a clock signal used to transmit or recover information communicated from or to the device,
- wherein the phase lock loop includes a voltage controlled oscillator for generating the clock signal, the voltage controlled oscillator comprising,
- a first transistor having first, second and third terminals;
- a second transistor having first, second and third terminals coupled to the first transistor in a push-push configuration;
- circuitry for a tunable phase coupling network coupled between respective first terminals of the first transistor and the second transistor;
- a pair of tunable coupled resonator networks coupled to the third terminals of each of the transistors through a tuning voltage network; and
- a dynamically tuned combiner network coupled between respective first terminals of the first and second transistors,
- wherein the voltage of the tuning network can be adjusted to tune an output signal generated by said dynamically tuned combiner network.

24. The telephone according to claim 23, wherein the dynamically tuned combiner network is configured to generate an output frequency being twice a fundamental frequency of the first and second transistors, and the output is dynamically tuned as a voltage level of the pair of tunable coupled resonator networks is adjusted.

* * * * *